(12) United States Patent
Wei et al.

(10) Patent No.: US 7,723,229 B2
(45) Date of Patent: May 25, 2010

(54) PROCESS OF FORMING A SELF-ALIGNED CONTACT IN A SEMICONDUCTOR DEVICE

(75) Inventors: An Chyi Wei, Hsinchu (TW); Chung Tai Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 781 days.

(21) Appl. No.: 11/111,345

(22) Filed: Apr. 22, 2005

(65) Prior Publication Data

US 2006/0240654 A1 Oct. 26, 2006

(51) Int. Cl.
*H01L 21/4763* (2006.01)
(52) U.S. Cl. ............... 438/639; 438/734; 257/E21.252; 257/E21.507; 257/E21.577
(58) Field of Classification Search ................. 438/445, 438/537, 506, 636, 597, 671, 666, 586, 229, 438/233, 523, 524, 533, 695, 696, 734, 705, 438/924, 618, 706, 639, 634; 257/E21.226, 257/E21.252, E21.257, E21.577–E21.579, 257/E21.507
See application file for complete search history.

(56) References Cited

U.S. PATENT DOCUMENTS

| | | | | |
|---|---|---|---|---|
| 5,933,755 A * | 8/1999 | Lee | ............................. | 438/634 |
| 6,239,011 B1 * | 5/2001 | Chen et al. | .................. | 438/595 |
| 6,277,752 B1 * | 8/2001 | Chen | .......................... | 438/692 |
| 6,287,957 B1 * | 9/2001 | Linliu | ......................... | 438/634 |
| 6,329,292 B1 | 12/2001 | Hung et al. | | |
| 6,331,495 B1 * | 12/2001 | Becker | ........................ | 438/774 |
| 6,468,920 B2 * | 10/2002 | Park et al. | .................... | 438/723 |
| 6,613,683 B2 | 9/2003 | Hwangbo et al. | | |
| 6,649,500 B2 * | 11/2003 | Koga | .......................... | 438/585 |
| 6,716,766 B2 * | 4/2004 | Ko | ............................. | 438/734 |
| 7,074,724 B2 * | 7/2006 | Donohoe et al. | ............ | 438/714 |
| 2001/0041450 A1 * | 11/2001 | Matsumoto et al. | ........ | 438/710 |
| 2002/0058402 A1 * | 5/2002 | Wieczorek et al. | .......... | 438/586 |
| 2003/0003714 A1 * | 1/2003 | Lee et al. | .................... | 438/636 |
| 2003/0121888 A1 * | 7/2003 | Adachi | ........................ | 216/71 |
| 2004/0038546 A1 * | 2/2004 | Ko | ............................. | 438/710 |
| 2004/0061238 A1 * | 4/2004 | Sekine | ....................... | 257/774 |
| 2005/0181588 A1 * | 8/2005 | Kim | ............................ | 438/586 |
| 2006/0051968 A1 * | 3/2006 | Joshi et al. | .................. | 438/723 |

FOREIGN PATENT DOCUMENTS

TW 527691 A * 4/2003

* cited by examiner

*Primary Examiner*—W. David Coleman
*Assistant Examiner*—Latanya Crawford
(74) *Attorney, Agent, or Firm*—Baker & McKenzie LLP

(57) ABSTRACT

A process is implemented to form a contact opening in a semiconductor device that includes a gate electrode on a substrate, a spacer on a sidewall of the gate electrode and a dielectric material covering the gate electrode. The process comprises forming a photoresist pattern on a surface of the dielectric material, etching the dielectric material until the bottom liner layer is exposed, forming a protective layer on a sidewall of the spacer while etching the dielectric material, and etching the bottom liner layer.

28 Claims, 4 Drawing Sheets

PROCESS OF FORMING A SELF-ALIGNED CONTACT IN A SEMICONDUCTOR DEVICE

BACKGROUND OF THE INVENTION

1. Field of the Invention

This invention generally relates to the manufacture of semiconductor devices, and more particularly to a process of forming self-aligned contact structures in a semiconductor device.

2. Description of the Related Art

Semiconductor integrated circuits generally include many conductive layers and active areas separated from one another via an insulating dielectric material. To electrically connect conductive layers and/or active areas separated by one dielectric layer, a contact hole or opening is formed through the dielectric layer and filled with a conductive material in physical contact with the conductive layers. Conventionally, the formation of the contact hole involves a number of technical processes, principally photolithography, etching and deposition processes.

As the size of semiconductor devices continuously decreases, the formation of the contact structure is subject to a narrower misalignment margin. Improper alignment of the contact structure may affect and even cause failure of the electrical connection within the semiconductor device. As a result, more stringent requirements are imposed on the manufacturing processes implemented to form the contact structure.

To overcome the problem of contact misalignment, one method commonly implemented uses the topography of the electrical device to ensure proper electrical connection of the contact hole. This method can advantageously form self-aligned contacts.

U.S. Pat. No. 6,329,292 issued to Hung et al., the disclosure of which is incorporated herein by reference, proposes a process of forming self-aligned contacts in a memory device. The memory device includes adjacent gate electrodes formed on a silicon substrate. Spacers made of silicon nitride are formed on the sidewalls of the gate electrodes, which then are covered with a dielectric layer. To establish electrical connection with an actively doped area of the substrate between two gate electrodes, an etching process is conducted through the dielectric layer to expose the underlying substrate. The etching process includes two etching steps implemented with different etching chemistries to ensure that the contact hole is formed without damaging adjacent structures. In particular, the second etching chemistry has to be correctly dosed to prevent undesirable polymer formation which might affect dielectric layer etching.

U.S. Pat. No. 6,613,683 issued to Hwangbo et al., the disclosure of which is also incorporated herein by reference, proposes another method of forming a self-aligned contact in a semiconductor device. The idea of the proposed method is to monitor the presence of a chemical compound produced while etching the dielectric layer. A predetermined level reached by the chemical compound indicates that the etching has reached the shoulders of the spacers. To prevent the spacer from over-etching, a second etching process with a modified etching chemistry is performed until the substrate is exposed, thereby forming the contact hole.

Practically, the foregoing methods do not bring satisfactory results in forming the contact hole. In particular, the spacers might still be eroded along with the etching of the dielectric layer and the bottom liner layer to expose the substrate. The thinner spacers adversely reduce the breakdown voltage window of the semiconductor device, and consequently its performance.

These technical issues call for an improved manufacturing method of the semiconductor devices to more efficiently and effectively form a contact structure without damaging the spacers.

SUMMARY OF THE INVENTION

The present application describes a process of forming a self-aligned contact opening in a semiconductor device. The semiconductor device includes one or more gate electrode structure formed over a substrate, a spacer formed on a sidewall of the gate electrode structure, a bottom liner layer laid over the substrate and adjacent to the spacer, and a dielectric material covering the gate electrode structure.

In an embodiment, the process comprises forming a photoresist pattern on a surface of the dielectric material, etching the dielectric material until the bottom liner layer is exposed, forming a protective layer on a sidewall of the spacer while etching the dielectric material, and etching the bottom liner layer.

In some embodiments, forming the protective layer on the spacer while etching the dielectric material includes forming a masking deposit on a shoulder of the spacer, and etching the dielectric material until the bottom liner layer is exposed to form the protective layer, wherein forming a masking deposit includes momentarily modifying one or more etching conditions during etching of the dielectric material.

In another embodiment, the process of forming the contact opening comprises etching the dielectric material with a first set of etching conditions to expose the bottom liner layer, forming a masking deposit on a shoulder of the spacer reached while etching the dielectric material, etching the exposed bottom liner layer, and removing the masking deposit.

In some embodiments, forming a masking deposit on a shoulder of the spacer includes momentarily modifying the first set of etching conditions to a second set of etching conditions. In some variations, momentarily modifying the first set of etching conditions to the second set of etching conditions includes increasing a plasma gas pressure from 50 milli-Torr to 55 milli-Torr for a predetermined period of time.

In some embodiments, etching the exposed bottom liner layer includes performing a reactive ion etching process. In one variant embodiment, the bottom liner layer includes silicon nitride, and the reactive ion etching process uses an etching chemistry including $CH_3F$ and $O_2$. In another variant embodiment, the bottom liner layer includes siliconoxide, and the reactive ion etching process uses an etching chemistry including $C_4F_6$.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENTS

FIG. 1A through 1G are schematic views of a process of forming a self-aligned contact opening in a semiconductor device according to an embodiment of the invention. In the following description, the term "contact" means a conductive contact formed between a semiconductor substrate or device and an overlying conductive layer. With modifications that would be apparent to those of skill in the art based on the description herein, the embodiments of the invention also can be applied to plugs, vias, trenches, holes and other vertical interconnect structures. Therefore, the term "contact" may include these structures as well. Accordingly, the following detailed description is not to be taken in a limiting sense, and the scope of the present invention is defined only by the appended claims.

Figure 1A:
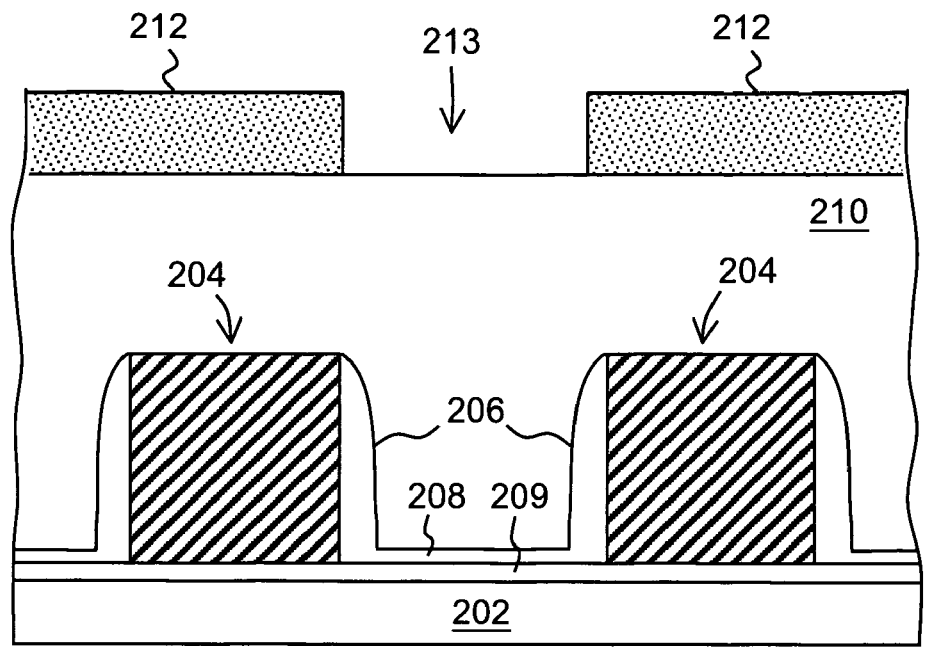
FIG. 1A is a schematic view of an intermediate starting stage in the process of forming a contact opening in a semiconductor device according to an embodiment of the invention.

FIG. 1A illustrates an intermediate starting stage in the manufacture of a semiconductor device, in which stacks of gate electrode structure 204 are formed over a substrate 202. A gate-insulating layer 209 is interposed between each stack of gate electrode structure 204 and the surface of the substrate 202. In this embodiment, the substrate 202 may be made of silicon, the gate-insulating layer 209 may be made of silicon oxide, and the stacks of gate electrode structure 204 may include a semiconductor layer, an insulating layer and a conductive layer stacked up, respectively (not shown). Spacers 206 are formed on the sidewalls of each stack of the gate electrode structures 204 and include a bottom portion 208 on the gate-insulating layer 209 between two gate electrode structures 204. In the embodiment, the spacers 206 may be made of silicon nitride, and the bottom liner layer between two gate electrode structures 204 thus may include silicon nitride and silicon oxide.

A dielectric layer 210 is deposited over the substrate 202 to cover the gate electrode structures 204. The dielectric layer 210 may be made of silicon oxide. A photoresist pattern 212 is formed on the surface of the dielectric layer 210. The photoresist pattern 212 includes an opening 213 defined to form a self-aligned contact opening between two gate electrode structures 204.

Figure 1B:
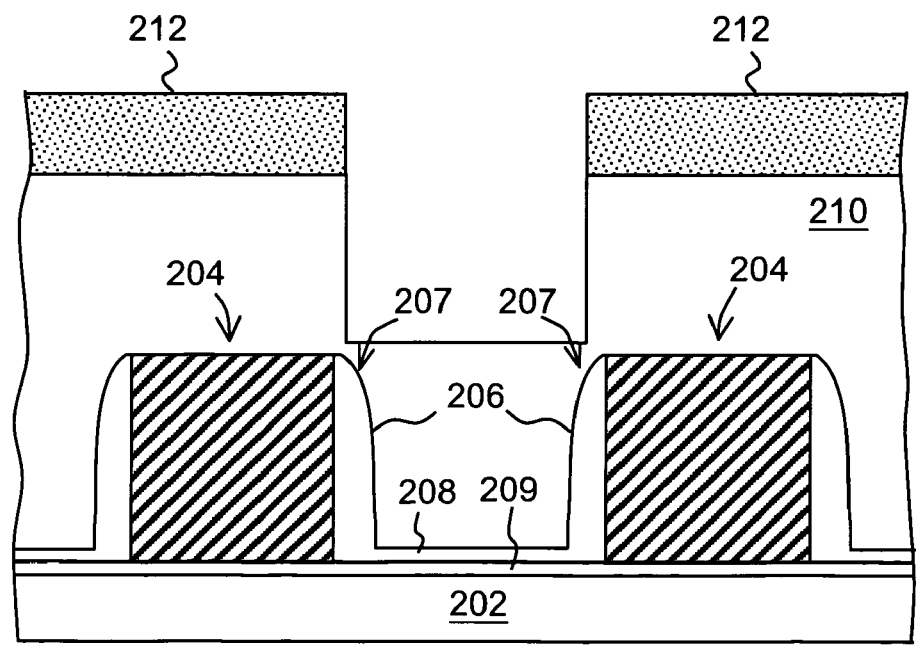
FIG. 1B is a schematic view of a first etching phase in the process of forming a contact opening according to an embodiment of the invention.

Referring to FIG. 1B, the dielectric layer 210 is etched using the photoresist pattern 212 as an etching mask. In the illustrated embodiment, a plasma etching process is implemented with $C_4F_6$ and $O_2$ as the main etching gases at a pressure of about 50 milli-Torrs. This first etching stage is conducted until the shoulders 207 of the spacers 206 are reached by an etch endpoint detection method.

Figure 1C:
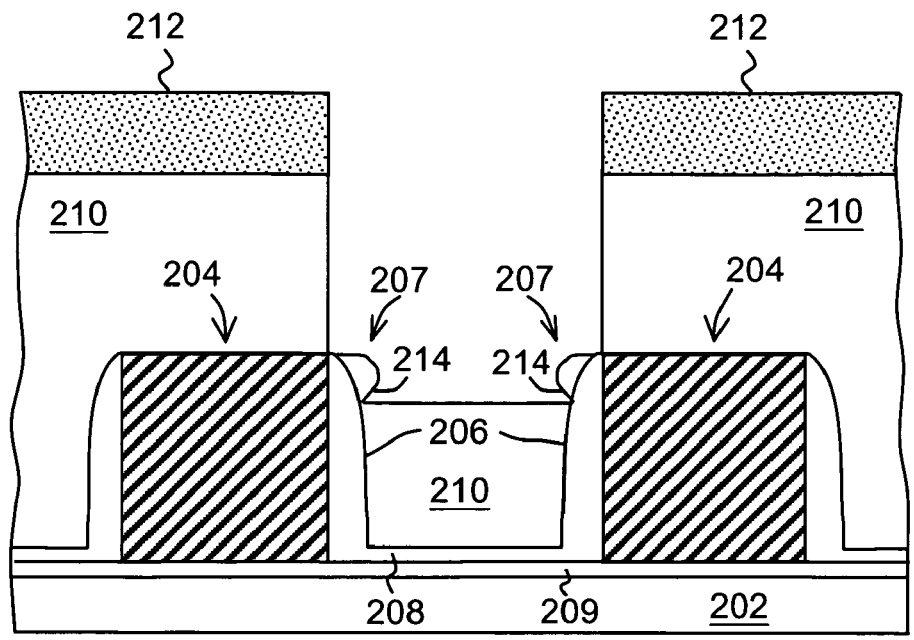
FIG. 1C is a schematic view of a second etching phase implemented to form a masking deposit in the process of forming a contact opening according to an embodiment of the invention.

Referring to FIG. 1C, in a second etching stage, the dielectric layer 210 is etched deeper while masking deposits 214 are formed on the shoulders 207 of the spacers 206. In the illustrated embodiment, the second etching stage is conducted by modifying the pressure of the plasma etching process from 50 milli-Torr to about 55 milli-Torr and the gas ratio of $C_4F_6/O_2$ from 1.0 to 1.1, respectively, for a predetermined period of time (e.g. some seconds) to form polymer on the exposed shoulders 207. The polymer formation constitutes the masking deposits 214.

Figure 1D:
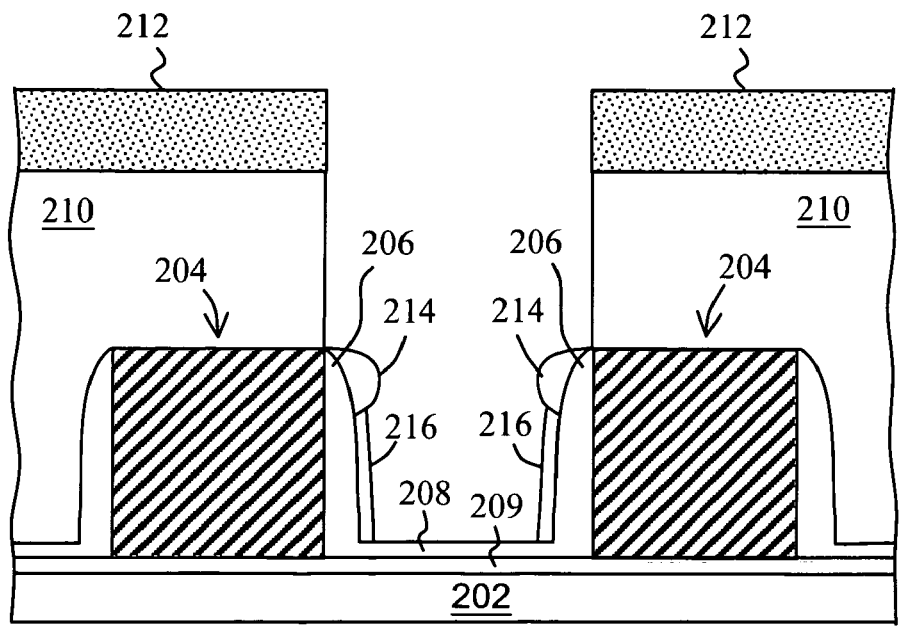
FIG. 1D is a schematic view of a third etching phase implemented to form a protective layer on a spacer in the process of forming a contact opening according to an embodiment of the invention.

Referring to FIG. 1D, the dielectric layer 210 undergoes a third etching stage with an etching gaseous mixture of higher polymer composition until the bottom portion 208 of the silicon nitride is exposed, e.g., when the silicon nitride can be detected by an etch endpoint. Owing to the presence of the masking deposits 214, the third etching stage leaves thin sheath layers 216 of silicon oxide on the sidewall of the spacers 206. The third etching stage can be a plasma etching process similar to that of the first etching stage.

Figure 1E:
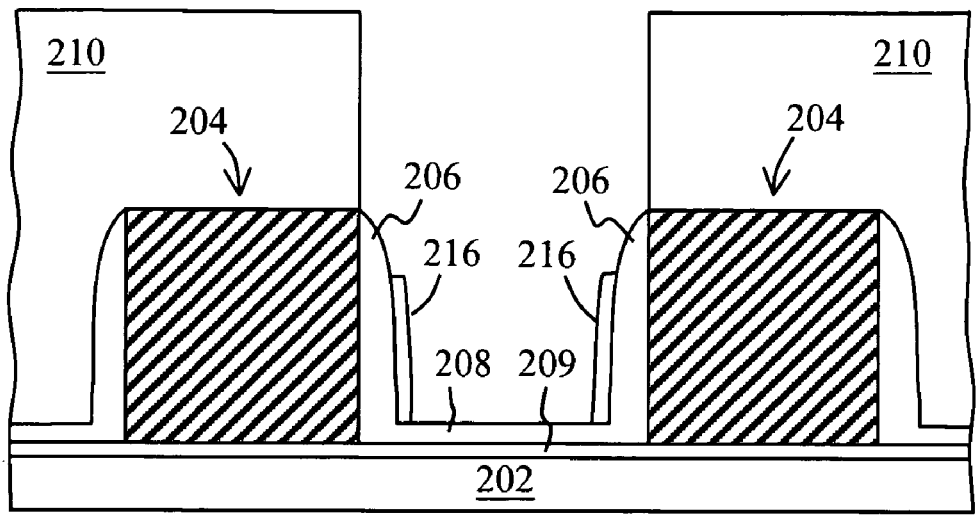
FIG. 1E is a schematic view illustrating the etching process of a masking deposit in the process of forming a contact opening according to an embodiment of the invention.

Referring to FIG. 1E, the photoresist pattern 212, masking deposits 214 and etching-by-products are removed by $O_2$ flushing for a predetermined period of time, e.g., some seconds, which leaves the sheath layers 216 substantially covering the sidewall of the spacers 206.

Figure 1F:
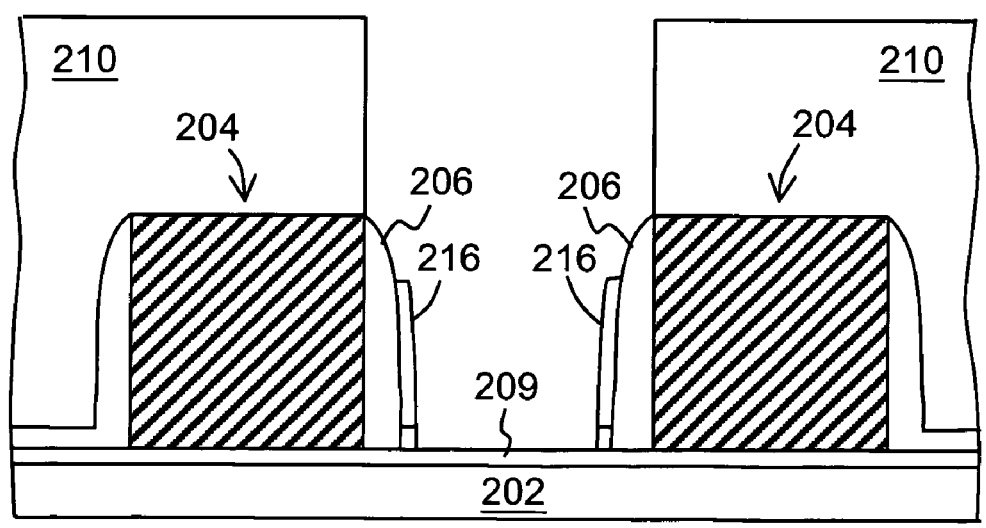
FIG. 1F is a schematic view of a fourth etching phase implemented to remove a bottom liner layer in the process of forming a contact opening according to an embodiment of the invention.

In FIG. 1F, the bottom portion 208 of silicon nitride is etched with a high selectivity of silicon nitride relative to silicon oxide to expose the surface of the gate-insulating layer 209 made of silicon oxide. In this embodiment, a reactive ion etching process is implemented with $CH_3F$ and $O_2$ to etch away the silicon nitride of the bottom portion 208. The sheath layers 216 of silicon oxide protect the spacers 206 from being eroded while the bottom layer 208 of silicon nitride is etched away.

Figure 1G:
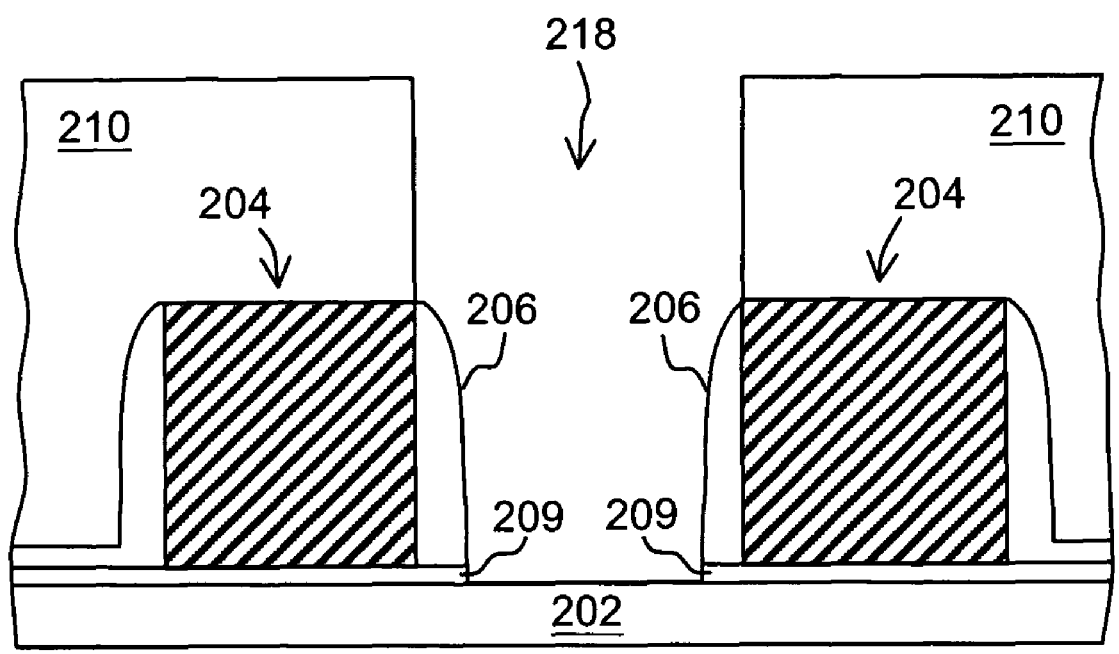
FIG. 1G is a schematic view of a completed contact opening formed in the semiconductor device according to an embodiment of the invention.

Referring to FIG. 1G, while using $C_4F_6$ with a high selectivity of silicon oxide relative to silicon nitride in the reactive ion etching, the silicon oxide portion of the gate-insulating layer 209 is removed along with the sheath layers 216 to expose the substrate 202, which completes the formation of the contact opening 218. A conductive material then may be deposited in the contact opening 218 to achieve the contact plug (not shown).

Though the invention has been illustrated with reference to specific embodiments, it is intended that the inventive features and characteristics described herein be applicable in many variations. For example, the methodology described herein can be applicable to any structure topographies of the semiconductor device similar to the foregoing level of gate electrode. The formation of the masking deposit can be obtained by modifying diverse etching conditions such as the composition of the etching chemistry. In addition, the etching method described herein can be applicable to any materials of the dielectric layer other than silicon oxide such as borophosphorous silicate glass (BPSG), phosphosilicate glass (PSG), or like materials.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A process of forming a contact opening in a semiconductor device, wherein the semiconductor device includes one or more gate electrode structure formed over a substrate, a spacer formed on a sidewall of the gate electrode structure, a bottom liner layer laid over the substrate and adjacent to the spacer, and a dielectric material covering the gate electrode structure, the process comprising:

forming a patterned masking layer on a surface of the dielectric material;

etching a portion of the dielectric material through the masking layer until a shoulder of the spacer is reached;

forming a masking deposit on the shoulder of the spacer from residue of the etched dielectric material;

etching the dielectric material with the masking deposit on the shoulder of the spacer until the bottom liner layer is exposed, wherein etching the dielectric material produces a protective layer on a sidewall of the spacer;

removing the masking deposit from the shoulder of the spacer; and etching the exposed bottom liner layer using the protective layer as a mask.

2. The process according to claim 1, wherein etching a portion of the dielectric material through the photoresist pattern includes performing a plasma etching process.

3. The process according to claim 1, wherein forming a masking deposit on the shoulder of the spacer is performed while etching the dielectric material.

4. The process according to claim 3, wherein forming a masking deposit on the shoulder of the spacer includes momentarily modifying one or more etching condition during etching the dielectric material.

5. The process according to claim 4, wherein momentarily modifying one or more etching condition includes increasing a plasma gas pressure from about 50 milli-Torr to about 55 milli-Torr and an etching gas ratio of $C_4F_6/O_2$ from 1.0 to 1.1 for a predetermined time.

6. The process according to claim 1, wherein the masking deposit includes a polymer deposit.

7. The process according to claim 1, wherein the dielectric material includes silicon oxide.

8. The process according to claim 1, wherein the spacer includes silicon nitride.

9. The process according to claim 1, wherein etching the bottom liner layer includes performing a reactive ion etching process.

10. The process according to claim 9, wherein the bottom liner layer includes silicon nitride and silicon oxide, and the reactive ion etching process uses an etching chemistry including $CH_3F$ and $O_2$ to etch the silicon nitride.

11. The process according to claim 9, wherein the bottom liner layer includes silicon nitride and silicon oxide, and the reactive ion etching process uses an etching chemistry including $C_4F_6$ to etch the silicon oxide.

12. A process of forming a contact opening between semiconductor devices, wherein the semiconductor devices each have a structure topography comprised of a substrate, a spacer over the substrate, a bottom liner layer laid on the substrate and adjacent to the spacer, and a dielectric material covering the spacer and the bottom liner layer, the process comprising:

forming a patterned masking layer on a surface of the dielectric material;

etching the dielectric material until the bottom liner layer is exposed;

forming a protective layer on sidewalls of the spacers while etching the dielectric material, the protective layer including residue of the etched dielectric material; and etching the exposed bottom liner layer using the protective layer as a mask.

13. The process according to claim 12, wherein forming a protective layer on the spacer comprises: forming a masking deposit on a shoulder of the spacer reached while etching the dielectric material; and etching the dielectric material until the bottom liner layer is exposed to form the protective layer on the sidewall of the spacer.

14. The process according to claim 13, wherein forming a masking deposit includes momentarily modifying one or more etching condition during etching the dielectric material.

15. The process according to claim 14, wherein momentarily modifying one or more etching condition includes increasing an etching gas pressure and an etching gas ratio, respectively.

16. The process according to claim 15, wherein momentarily modifying one or more etching condition includes increasing an etching gas pressure from about 50 milli-Torr to about 55 milli-Torr and an etching gas ratio of $C4F_6/O_2$ from 1.0 to 1.1 for a predetermined time.

17. The process according to claim 12, wherein etching the exposed bottom liner layer includes performing a reactive ion etching process.

18. The process according to claim 17, wherein the bottom liner layer includes silicon nitride and silicon oxide, and the reactive ion etching process uses an etching chemistry including $CH_3F$ and $O_2$ to etch silicon nitride.

19. The process according to claim 17, wherein the bottom liner layer includes silicon nitride and silicon oxide, and the reactive ion etching process uses an etching chemistry including $C_4F_6$ to etch the silicon oxide.

20. A process of forming a contact opening in a semiconductor device, wherein the semiconductor device has a structure topography comprised of a substrate, a spacer over the substrate, a bottom liner layer laid on a gate-insulating layer and adjacent to the spacer, and a dielectric material covering the spacer and the bottom liner layer, the process comprising:

forming a photoresist pattern on a surface of the dielectric material;

etching the dielectric material with a first set of etching conditions until a shoulder of the spacer is reached;

forming a masking deposit on the shoulder of the spacer with a second set of etching conditions, wherein the masking deposit is formed of residue remaining from the etched dielectric material, the second set of etching conditions including a higher ability to deposit a polymer than the first set of etching conditions;

further etching the dielectric layer with a third set of etching conditions to expose the bottom liner layer, the further etching leaving a protective layer on a sidewall of the spacer;

etching the exposed bottom liner layer; and etching the masking deposit.

21. The process according to claim 20, wherein etching the dielectric material includes performing a plasma etching process.

22. The process according to claim 20, wherein forming a masking deposit on a shoulder of the spacer includes momentarily modifying the first set of etching conditions to a second set of etching conditions.

23. The process according to claim 22, wherein momentarily modifying the first set of etching conditions to a second set of etching conditions includes increasing an etching gas pressure from about 50 milli-Torr to about 55 milli-Torr and an etching gas ratio of $C_4F_6/O_2$ from 1.0 to 1.1 for a predetermined time.

24. The process according to claim 20, wherein the masking deposit is configured to leave a protective liner layer on a sidewall of the spacer while etching the dielectric material deeper to expose the bottom liner layer.

25. The process according to claim 24, wherein the masking deposit includes a polymer deposit.

26. The process according to claim 20, wherein etching the exposed bottom liner layer includes performing a reactive ion etching process.

27. The process according to claim 26, wherein the bottom liner layer includes silicon nitride and silicon oxide, and the reactive ion etching process uses an etching chemistry including $CH_3F$ and $O_2$ to etch the silicon nitride.

28. The process according to claim 26, wherein the bottom liner layer includes silicon nitride and silicon oxide, and the reactive ion etching process uses an etching chemistry including $C_4F_6$ to etch the silicon oxide.

* * * * *